United States Patent
Brekelmans et al.

(10) Patent No.: US 6,795,695 B1
(45) Date of Patent: Sep. 21, 2004

(54) RECEIVER HAVING NARROW BANDWIDTH PHASE-LOCKED LOOP DEMODULATOR

(75) Inventors: Johannes H. A. Brekelmans, Singapore (SG); Hans J. Kunz, Buchholz (DE); Johannes S. Vromans, Nijmegan (NL)

(73) Assignee: U.S. Philips Corporation, New York, NY (US)

( * ) Notice: Subject to any disclaimer, the term of this patent is extended or adjusted under 35 U.S.C. 154(b) by 767 days.

(21) Appl. No.: 09/082,449

(22) Filed: May 20, 1998

(30) Foreign Application Priority Data

May 23, 1997 (EP) .............................. 97201542

(51) Int. Cl.[7] ................................. H04B 1/18
(52) U.S. Cl. ................................. 455/192.2; 455/265
(58) Field of Search ............................. 455/208, 209, 455/192.2, 192.3, 196.1, 255, 257, 258, 259, 260, 264, 265, 315, 316; 329/325; 331/16, 19

(56) References Cited

U.S. PATENT DOCUMENTS 4,305,157 A * 12/1981 Mogi .......................... 455/183
5,335,364 A * 8/1994 Heinonen ..................... 455/76
5,388,125 A * 2/1995 Toda et al. ............... 455/192.2
5,408,196 A   4/1995 Sempel et al. ............... 329/325

FOREIGN PATENT DOCUMENTS

EP   0512624 A1   11/1992
EP   0757433 A1    2/1997

* cited by examiner

Primary Examiner—Lee Nguyen (57) ABSTRACT

A receiver having a phase-locked loop (PLL) for synchronizing its oscillator with a carrier (CA). A calibration circuit (CAL) calibrates the phase-locked loop's oscillator (OSC) in the following manner. It measures (FMC) the frequency difference (dF) between a nominal frequency (Fnom) of the carrier (CA) and a frequency (Fosc) of the phase-locked loop's oscillator (OSC). Furthermore, it adjusts the frequency (Fosc) of the PLL oscillator in accordance with the measured frequency difference (dF). As a result, the phase-locked loop's oscillator will be substantially tuned to the nominal frequency of the carrier. The actual frequency of the carrier may differ from the nominal frequency. In general, such a difference will be sufficiently small for the phase-locked loop (PLL) to capture the carrier (CA).

8 Claims, 6 Drawing Sheets

RECEIVER HAVING NARROW BANDWIDTH PHASE-LOCKED LOOP DEMODULATOR

BACKGROUND OF THE INVENTION

This invention relates to the calibration of an oscillator which forms part of a phase-locked loop (PLL).

U.S. Pat. No. 5,408,196 describes a receiver which includes a PLL for demodulating an FM signal. In the receiver, a band-pass filter is coupled to a signal input of a phase detector which forms a part of the PLL. In a calibrating state, a switch connects a signal source to the band-pass filter. The signal source preferably provides a broadband noise signal. There is an overlap between the passband of the band-pass filter and the spectrum of the signal source. Therefore, the signal source will generate, via the band-pass filter, a signal with a spectrum in the passband of the band-pass filter at the signal input of the phase detector. In response to this signal, the PLL will draw the frequency of its oscillator towards the passband. At the end of the calibration a lock signal which is developed at the control input of the PLL's oscillator, is stored in a memory. This lock signal will be supplied as a tuning signal to the PLL's oscillator, and will tune it within the passband.

SUMMARY OF THE INVENTION

The invention seeks, inter alia, to provide for the calibration of an oscillator forming part of a PLL which, with respect to the background art, is better suited for a wide variety of applications. Claims 1, 6 and 7 define, respectively, a receiver, an integrated circuit and a method of calibrating an oscillator which forms part of a PLL, in accordance with the invention. Additional features, which may be optionally used to implement the invention to advantage, are defined in the dependent claims.

The invention takes the following aspects into consideration. A PLL may receive a carrier via a filter whose centre frequency may not correspond to the nominal frequency of the carrier. For example, let it be assumed that a PLL is used for demodulating a video-modulated carrier in a television (TV) receiver suited for conventional terrestrial TV broadcast signals. In that case, the PLL will receive the video-modulated carrier via a filter which has a Nyquist slope at one end of its passband. The nominal frequency of the video-modulated carrier will substantially be at the centre of the Nyquist slope. However, the centre frequency of the filter will be substantially half-way the two ends of the passband which is, for example, 6 MHz wide. That is, the centre frequency of the filter will be located approximately 3 Mhz away from the nominal frequency of the video-modulated carrier.

In the background art, the frequency of the PLL's oscillator will substantially correspond to the centre frequency of the band-pass filter when the calibration has been completed. If the nominal frequency of a carrier does not substantially correspond to the centre frequency, it may prevent the PLL from capturing the carrier. For example, in a TV receiver application as described above, the PLL's oscillator will be approximately 3 MHz away from the nominal frequency of the video-modulated carrier if it is calibrated in accordance with the background art. The PLL will preferably have a relatively small loop bandwidth, for example in the order of a few kHz, to prevent parasitic modulation of the PLL's oscillator which may cause interference. With such a small loop bandwidth, the PLL will not be able to capture the video-modulated carrier which is at a distance in frequency of 3 MHz. Rather, it will parasitically capture one of the sidebands of the video-modulated carrier, in particular, a sideband which is a multiple of the line frequency used.

In accordance with the invention, a frequency difference between the nominal frequency of the carrier and the frequency of the PLL's oscillator is measured, and the latter is adjusted in accordance with the measured frequency difference. As a result, the PLL's oscillator will be relatively close in frequency to the carrier which is supplied to the PLL. Consequently, the PLL will be able to capture the carrier without great difficulty, even if the PLL has a relatively small loop bandwidth. Moreover, in this respect, it does not matter via which type of filter, if any, the carrier is supplied to the PLL. Thus, the invention is better suited for a wide variety of applications than the background art.

Another advantage of the invention with respect to the background art relates to the following aspect. In the background art, the signal source and the switch, which form part of the circuitry for calibrating the PLL's oscillator, are separated from the PLL by the filter via which the carrier is supplied to the PLL. In many cases, it will be difficult, if not impossible, to realize the filter in the form of an integrated circuit. If, nevertheless, the signal source and the switch are realized in an integrated circuit together with the PLL, certain problems may arise. For example, there may be insufficient filtering due to a parasitic capacitance between two pins of the integrated circuit, one of the two pins being coupled to an input of the filter and the other pin to an output.

In contradistinction, in the invention, the PLL as well as the circuitry for calibrating the PLL's oscillator may form a part of a single integrated circuit without this leading to any appreciable problems. Thus, the invention is better suited for implementation on a single integrated circuit than the background art. Such an implementation generally contributes to cost-efficiency.

BRIEF DESCRIPTION OF THE DRAWING

The invention and additional features, which may optionally be used to implement the invention to advantage, will be apparent from and elucidated with reference to the drawings described hereinafter.

In the drawings.

DESCRIPTION OF THE PREFERRED EMBODIMENTS

First, some remarks will be made on the use of reference labels. Similar entities are denoted by an identical letter code throughout the drawings. In a single drawing, various similar entities may be shown. In that case, a numeral is added to the letter code to distinguish similar entities from each other. The numeral will be in parentheses if the number of similar entities is a running parameter. In the description and the claims, any numeral in a reference sign may be omitted if this is appropriate.

Figure 1:
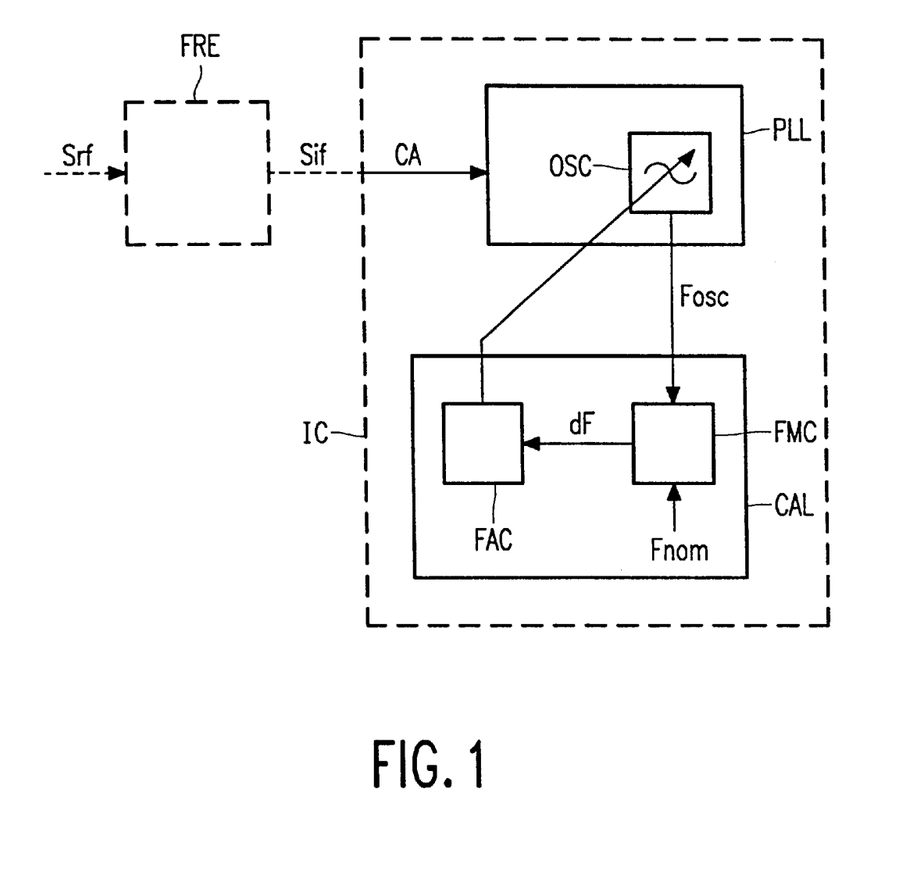
FIG. 1 is a conceptual diagram illustrating basic features of the invention.

FIG. 1 illustrates basic features of the invention by solid lines. A phase-locked loop PLL is provided for synchronizing an oscillator OSC, which forms part of the phase-locked loop PLL, with a carrier CA. A calibration circuit CAL calibrates the phase-locked loop's oscillator OSC as follows. In the calibration circuit CAL, a frequency measurement circuit FMC measures the frequency difference dF between a nominal frequency Fnom of the carrier and a frequency Fosc of the phase-locked loop's oscillator OSC. Furthermore, a frequency adjustment circuit FAC adjusts the frequency Fosc of the phase-locked loop's oscillator OSC in accordance with the measured frequency difference dF. As a result, the phase-locked loop's oscillator OSC will be substantially tuned to the nominal frequency Fnom of the carrier CA. The actual frequency of the carrier CA may differ from the nominal frequency Fnom. In general, such a difference will be sufficiently small for the phase-locked loop PLL to capture the carrier CA.

By broken lines, FIG. 1 also illustrates the following. A front-end FRE processes an input signal Srf to obtain an intermediate signal Sif which contains the carrier CA. The phase-locked loop PLL and the calibration circuit CAL may form part of an integrated circuit IC.

Figure 2:
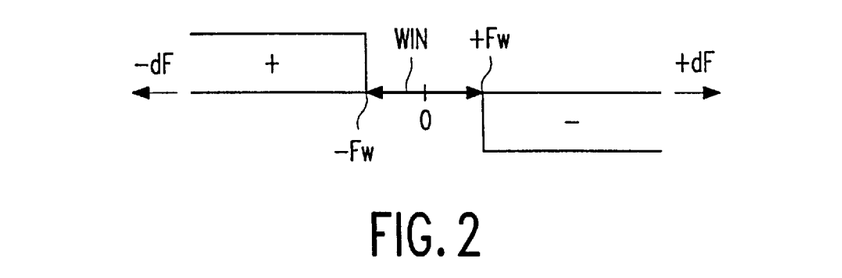
FIGS. 2 to 5 are conceptual diagrams illustrating additional features which may optionally be used to implement the invention to advantage.

FIG. 2 illustrates the following additional feature. The frequency adjustment circuit substantially does not adjust the frequency of the phase-locked loop's oscillator throughout a range WIN of frequency differences dF substantially centred around zero (0). FIG. 2 is a frequency diagram in which the frequency difference dF is plotted on the horizontal axis. The frequency difference dF will have a positive value if the frequency of the phase-locked loop's oscillator is higher than the nominal frequency of the carrier. The frequency difference dF will have a negative value if the inverse applies. If the frequency difference dF has a negative value which is below a certain negative threshold frequency −Fw, the frequency adjustment circuit will increase the frequency of the phase-locked loop's oscillator. In FIG. 2, this is indicated by a + sign above the horizontal axis. If the frequency difference dF has a positive value which is above a certain positive threshold frequency +Fw, the frequency adjustment circuit will decrease the frequency Fosc of the phase-locked loop's oscillator, which is indicated by a − sign below the horizontal axis. The threshold frequencies +Fw and −Fw form the boundaries of the range WIN in which the frequency adjustment circuit substantially does not adjust the frequency of the phase-locked loop's oscillator.

The FIG. 2 feature takes the following aspects into consideration. With reference to FIG. 1, there are two criteria on the basis of which the phase-locked loop's oscillator OSC may be adjusted. The first criterion is the frequency difference dF between the nominal frequency Fnom of the carrier CA and the frequency Fosc of the phase-locked loop's oscillator OSC. The second criterion is synchronization of the phase-locked loop's oscillator Fosc with the carrier CA. The two criteria will conflict if the actual frequency of the carrier CA is not exactly equal to the nominal frequency Fnom, which will generally be the case. The phase-locked loop PLL will not operate properly if there is such a conflict and if this conflict is not resolved.

If the FIG. 2 feature is applied, a conflict as described above is resolved in the following manner. The range WIN of frequency differences dF provides a window in which the phase-locked loop may capture the carrier so as to achieve synchronization, without any interference from the frequency adjustment circuit. The frequency adjustment circuit only adjusts relatively large frequency differences dF to bring the frequency of the phase-locked loop's oscillator sufficiently close to the actual frequency of the carrier, so that the phase-locked loop may capture the carrier and achieve synchronization. If, for any reason, synchronization is lost, the frequency adjustment circuit will, as it were, watch over the frequency of the phase-locked loop's oscillator such that the frequency difference dF with respect to the nominal frequency of the carrier remains with the range WIN. Accordingly, it prevents synchronization with any signal other than the carrier whose frequency differs more than +Fw or −Fw from the nominal frequency of the carrier. Thus, the FIG. 2 feature contributes to reliability.

Figure 3A:
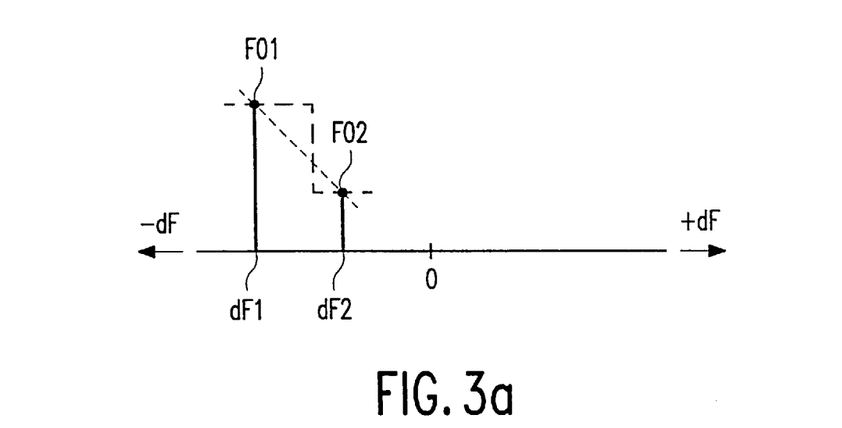

FIG. 3a illustrates the following additional feature. The frequency adjustment circuit adjusts the frequency of the phase-locked loop's oscillator with at least two different forces FO1, FO2 for two different frequency differences dF1, dF2, the strongest of the two forces, which is FO1, being used for the largest of the two frequency differences, which is dF1. FIG. 3a is a frequency diagram which has the same horizontal axis as the FIG. 2 frequency diagram. The two different forces FO1, FO2 are represented as pins with round heads, the longest pin representing the strongest force FO1. In FIG. 3a, two broken lines show two examples of how the adjustment of the phase-locked loop's oscillator may vary as a function of the frequency difference dF. One broken line illustrates that the force with which the phase-locked loop's oscillator is adjusted may vary stepwise as the frequency difference decreases from dF1 to dF2. The other broken line illustrates that the force may vary gradually as the frequency difference decreases from dF1 to dF2.

The FIG. 3a feature takes the following aspects into consideration. With reference to FIG. 1, the frequency measurement circuit FMC will require a certain amount of time to measure the frequency difference dF. The greater the accuracy of the frequency measurement, the greater the amount of time required. While the frequency difference dF is being measured, the frequency adjustment circuit FAC will adjust the frequency Fosc of the phase-locked loop's oscillator on the basis of the previously measured frequency difference. The greater the force with which the adjustment is being carried out and the greater the amount of time required for the frequency measurement, the greater the adjustment will be per frequency measurement. Instability will occur if the adjustment is too large when the frequency difference has almost been reduced to zero.

Figure 3B:
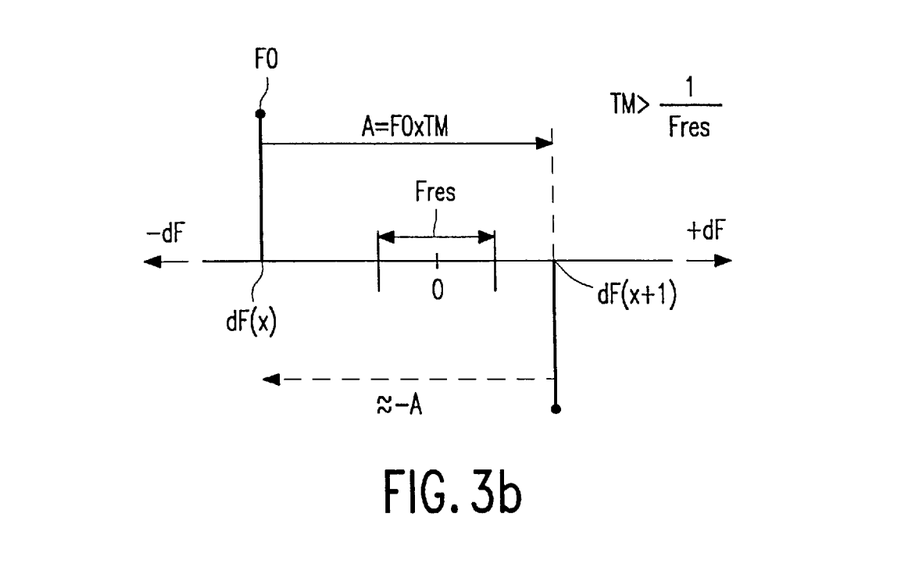

FIG. 3b illustrates an example of such instability by means of a frequency diagram which has the same horizontal axis as the FIG. 3a diagram. In FIG. 3b, Fres represents the accuracy with which the frequency difference dF is measured. FIG. 3b shows a measured frequency difference dF(x) which is relatively close to zero (0). Since the measured frequency difference dF(x) is below zero, the frequency of the phase-locked loop's oscillator is increased with a certain force FO during a period Tm which is the amount of time required for a frequency measurement with the accuracy Fres. As a result, an adjustment A=FO×Tm is carried out such that the next measured frequency difference F(x+1) is above zero. Consequently, a comparable adjustment of opposite sign will follow such that the next frequency measurement will again be below zero. Thus, the frequency of the phase-locked loop's oscillator will bounce back and forth substantially between F(x) and F(x+1), as it were, without the frequency difference dF measured with the accuracy Fres being equal to zero.

If the FIG. 3a feature is applied, the force FO1 may be relatively large such that the frequency difference dF1 is relatively quickly reduced to the smaller frequency difference dF2. Once the frequency difference is reduced to dF2, the smaller force FO2 is applied at dF2 in order to avoid any instability as described hereinbefore. Accordingly, the FIG. 3a feature allows a satisfactory compromise between, on the one hand, the speed of the frequency adjustment and, on the other hand, the accuracy of the frequency measurement which is also the accuracy with which the frequency of the phase-locked loop's oscillator is calibrated.

Figure 4:
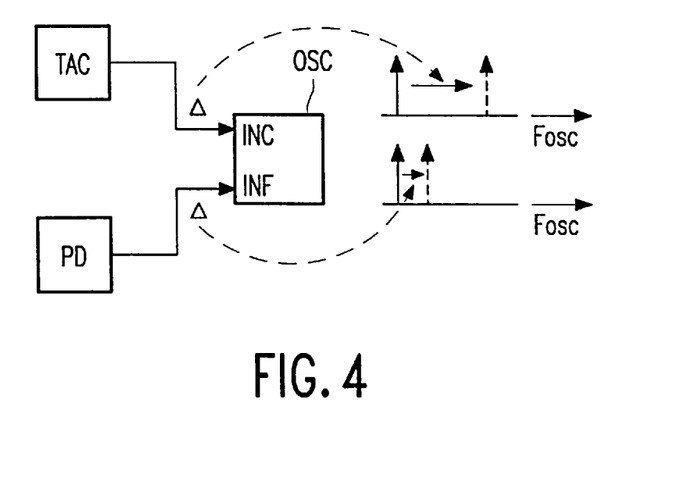

FIG. 4 illustrates the following additional feature. The phase-locked loop's oscillator OSC has a coarse frequency-adjustment input INC and a fine frequency-adjustment input INF. The frequency Fosc of the phase-locked loop's oscillator OSC is adjusted to a greater degree if a certain change Δ occurs at the coarse frequency-adjustment INC input than if the same change Δ occurs at the fine frequency-adjustment input INF. The coarse frequency-adjustment INC input is coupled to the frequency adjustment circuit FAC and the fine frequency-adjustment input INF is coupled to the phase-locked loop's phase detector PD.

The FIG. 4 feature takes the following aspects into consideration. On the one hand, a supply voltage or current will limit the range throughout which any frequency adjustment signal applied to the phase-locked loop's oscillator OSC may vary. On the other hand, the extent to which the frequency Fosc of the phase-locked loop's oscillator OSC should be adjusted may be relatively large, for example, if tolerances of frequency determining components in the phase-locked loop's oscillator OSC are rather poor. Thus, an input of the phase-locked loop's oscillator OSC which is coupled to the frequency adjustment circuit FAC needs to have a relatively high sensitivity in terms of voltage-to-frequency or current-to-frequency, if the supply voltage or current is relatively low and tolerances are rather poor. If, in that case, this input were also coupled to the phase-locked loop's phase detector PD, any noise in the phase-locked loop's phase detector PD would adversely affect the overall noise performance of the phase-locked loop to a relatively large extent.

If the FIG. 4 feature is applied, the fine frequency-adjustment input INF will receive a frequency adjustment signal for adjusting any remaining frequency difference between, on the one hand, the carrier which is supplied to the phase-locked loop and, on the other hand, the phase-locked loop's oscillator OSC after it has been calibrated. Such a frequency difference will generally be relatively small. Therefore, the frequency Fosc of the phase-locked loop's oscillator OSC needs to vary to a relatively small extent throughout the range within which the frequency adjustment signal may vary. Thus, the fine frequency-adjustment input INF may have a relatively low sensitivity in terms of voltage-to-frequency or current-to-frequency. Consequently, any noise in the phase-locked loop's phase detector PD will affect the overall noise performance of the phase-locked loop to a relatively small extent only. Thus, the FIG. 4 feature allows a satisfactory noise performance, even if a relatively low supply voltage or current is used and/or tolerances are rather poor.

Figure 5:
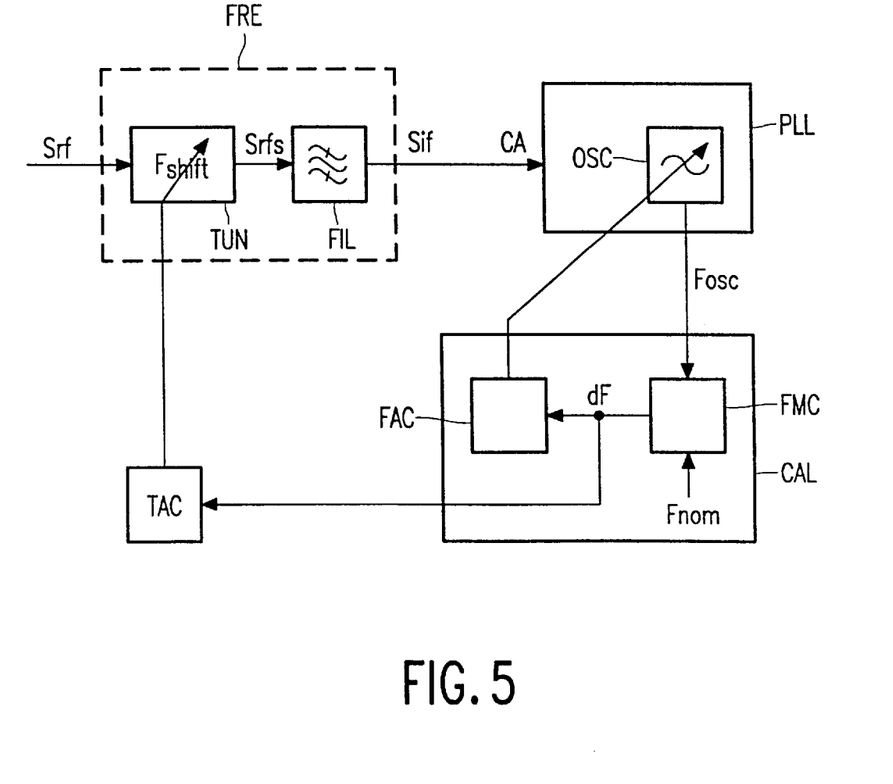

FIG. 5 illustrates the following additional features. The front-end FRE, also shown in FIG. 1, comprises a tuner TUN for shifting the input signal Srf in frequency to obtain a frequency-shifted input signal Srfs. It also comprises a filter FIL for extracting the intermediate signal Sif from the frequency-shifted input signal Srfs. A tuning adjustment circuit TAC adjusts the frequency-shift Fshift carried out by the tuner in accordance with the measured frequency difference dF between the nominal frequency Fnom of the intermediate signal Sif and the frequency Fosc of the phase-locked loop's oscillator OSC.

The FIG. 5 feature takes the following aspects into consideration. The quality of the intermediate signal Sif and, in particular, that of the carrier CA which forms part of it, depends on the frequency shift Fshift which is carried out by the tuner TUN. There is a certain frequency shift for which the frequency-shifted input signal Srfs is optimally located in frequency with respect to the characteristics of the filter FIL such that the intermediate signal Sif is extracted in the best possible manner. This will substantially be the case if the frequency of the carrier CA is at the nominal value for which the filter FIL has been designed.

If the FIG. 5 feature is applied, the tuning adjustment circuit TAC will adjust the frequency shift Fshift carried out by the tuner TUN in such a manner that the frequency of the carrier CA is substantially equal to its nominal value. As a result, the intermediate signal Sif and the carrier CA contained in it, will be optimally extracted from the frequency-shifted input signal Srfs. Consequently, the FIG. 5 feature contributes to reception quality.

It should be noted that the FIG. 5 feature is a solution to the problem that phase-locked loops as such are incapable of providing any tuner adjustment signal. Furthermore, it should be noted that if the FIG. 5 feature is applied, the frequency measurement circuit FMC effectively forms part of two different control loops. The first control loop includes the frequency adjustment circuit FAC and serves to adjust the phase-locked loop's demodulator OSC such that the phase-locked loop may reliably capture the carrier CA. The second control loop includes the tuning adjustment circuit TAC and serves to adjust the frequency shift Fshift carried out by the tuner TUN once the phase-locked loop's oscillator OSC is synchronized with the carrier CA.

Figure 6:
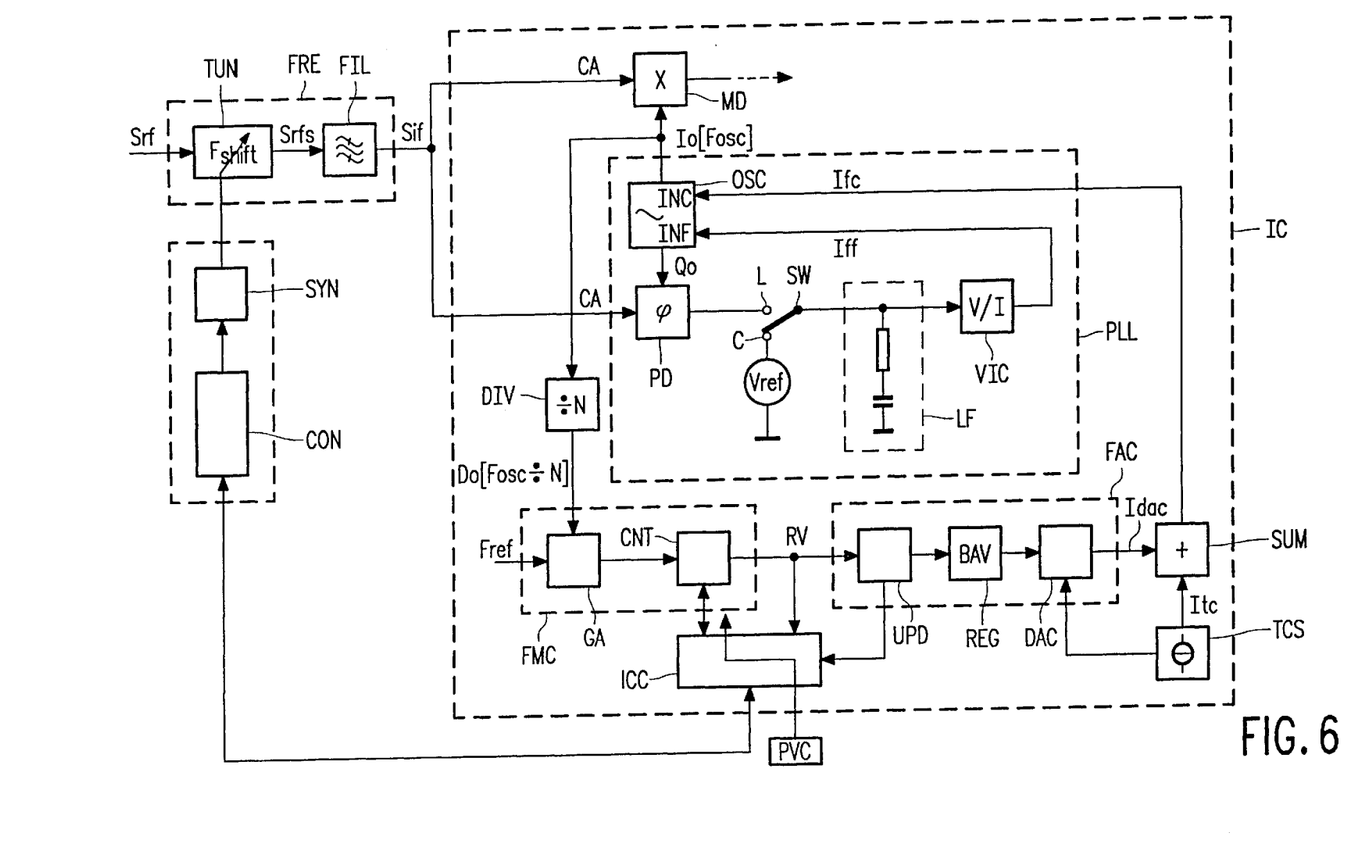
FIG. 6 is a block diagram of an example of a receiver in accordance to the invention.

FIG. 6 is an example of a receiver in accordance with the invention. The FIG. 6 receiver incorporates the features which are illustrated in FIGS. 1, 4 and 5 and which have been discussed hereinbefore. It may also incorporate the features illustrated in FIGS. 2 and 3a, as will be apparent from the description hereinafter.

In the FIG. 6 receiver, the frequency measurement circuit FMC is formed by a gate circuit GA and a counter circuit CNT. The frequency adjustment circuit is formed by an updating circuit UPD, a register REG and a digital-to-analog converter DAC. The tuning adjustment circuit TAC is formed by a main controller CON and a frequency-synthesizer SYN. The integrated circuit IC additionally includes a mixing device MD, a frequency divider DIV, a temperature-stabilized current source TCS, a summing circuit SUM and an interface and control circuit ICC. The phase-locked loop PLL includes a phase detector PD, a switch SW, a reference voltage source Vref, a loop filter LF and a voltage-to-current converter V/I.

The FIG. 6 receiver operates as follows. The phase-locked loop's oscillator OSC is a current-controlled phase-locked loop's oscillator whose frequency Fosc may be adjusted by means of a coarse frequency-adjustment current Ifc supplied to the coarse frequency-adjustment input INC, and by means of a fine frequency-adjustment current Iff supplied to the fine frequency-adjustment input INF. The coarse frequency-adjustment current Ifc is the sum of a temperature-stabilized current Itc and an adjustment current Idac provided by the digital-to-analog converter DAC. The value of the adjustment current Idac is determined by a binary adjustment value BAV which is stored in the register REG and supplied to the digital-to-analog converter DAC. The fine frequency-adjustment current Iff is kept at a constant value when the frequency Fosc of the phase-locked loop's oscillator OSC is calibrated. To that end, the switch SW is in position C such that the reference voltage Vref is supplied to the voltage-to-current converter V/I.

The phase-locked loop's oscillator OSC is calibrated as follows. A preset counter value PCV, which corresponds to the nominal frequency Fnom of the carrier CA, is loaded into the counter CNT via the interface and control circuit ICC. The counter CNT receives a frequency-divided oscillator signal Do as a clock signal via the gate circuit GA. The gate circuit GA provides a time window on the basis of a reference frequency Fref. Starting off from the preset counter value PCV, the counter CNT counts down one unit per full period of the frequency-divided oscillator signal Do during the time window. If the frequency Fosc of the phase-locked loop's oscillator OSC is at the desired value Fnom, the counter CNT will count down to zero during the time window. If, however, the frequency Fosc is too high, the counter will have a negative residue at the end of the time window. Conversely, if the frequency Fosc is too low, the counter CNT will have a positive residue. Thus the counter CNT provides a residual value RV which may be zero, negative or positive.

In the following example it is assumed that the FIG. 6 receiver is a TV receiver. The reference frequency Fref may be the color-carrier frequency which is 4.4336187 MHz in Europe and 3.579545 in the USA. The gate circuit GA provides a time window defined by 704 (64×11) cycles of the reference frequency Fref if it is 4.4336187 MHz or by 576 (64×9) cycles of the reference frequency Fref if it is 3.579545 MHz. Assuming that the frequency divider DIV divides by a factor of 4, the table below lists appropriate preset counter values in the PCV columns for various nominal frequencies Fnom of the carrier CA.

| Fref = 4.4336187 MHz | | Fref = 3.579545 Mhz | |
| --- | --- | --- | --- |
| Fnom (MHz) | PCV | Fnom (MHz) | PCV |
| 38.90 | 1544 | 38.90 | 1565 |
| 45.75 | 1816 | 45.75 | 1840 |
| 58.75 | 2332 | 58.75 | 2363 |
| 38.00 | 1508 | 38.00 | 1529 |
| 33.40 | 1326 | 33.40 | 1344 |

The updating circuit UPD updates the binary adjustment value BAV in the register REG on the basis of the residual value RV. It may do so in various ways. For example, a very basic manner may be as follows. If the residual value RV is negative or positive, the binary adjustment value BAV may be changed by a fixed amount, thereby causing a change in the coarse frequency-adjustment current Ifc, such that the frequency Fosc of the phase-locked loop's oscillator OSC is decreased or increased, respectively. If the residual value RV is zero, the binary adjustment value BAV is not changed and the updating circuit UPD may signal to the interface and control circuit ICC that the phase-locked loop's oscillator OSC has been calibrated. Alternatively, the updating circuit UPD may stop updating the binary adjustment value BAV when the residue value RV is sufficiently small but not zero. This is one of the possibilities to implement the FIG. 2 feature. The updating circuit UPD may also change the binary adjustment value BAV by an amount which is not fixed but rather depends on the residual value RV. This is one of the possibilities to implement the FIG. 3a feature.

Once the phase-locked loop's oscillator OSC has been calibrated as described hereinbefore, the switch SW is set to position L. This allows synchronization of the phase-locked loop's oscillator OSC and the carrier CA. The phase-locked loop's oscillator OSC provides two signals: a phase-quadrature oscillation signal Qo which is supplied to the phase-detector PD, and an in-phase oscillation signal Io which is supplied to the mixing device MD. The mixing device MD effectively multiplies the carrier CA with the in-phase oscillation signal Io. Accordingly, it carries out a synchronous demodulation once the phase-locked loop's oscillator OSC is synchronized with the carrier CA.

The counter CNT remains active even when the phase-locked loop's oscillator OSC has been calibrated and synchronized. In this case, the residual value RV is a measure of any deviation that the actual frequency of the carrier CA may have with respect to its nominal frequency Fnom. Such a deviation is reduced in the following manner. The residual value RV is supplied, in one form or the other, to the main controller CON via the interface and control circuit ICC. In response thereto, the main controller CON adjusts the frequency synthesizer SYN, which determines the frequency shift Fshift carried out by the tuner TUN, such that the residual value RV becomes zero or substantially zero. In this respect, the FIGS. 2 and 3a features may be applied in an equivalent manner.

Figure 7A:
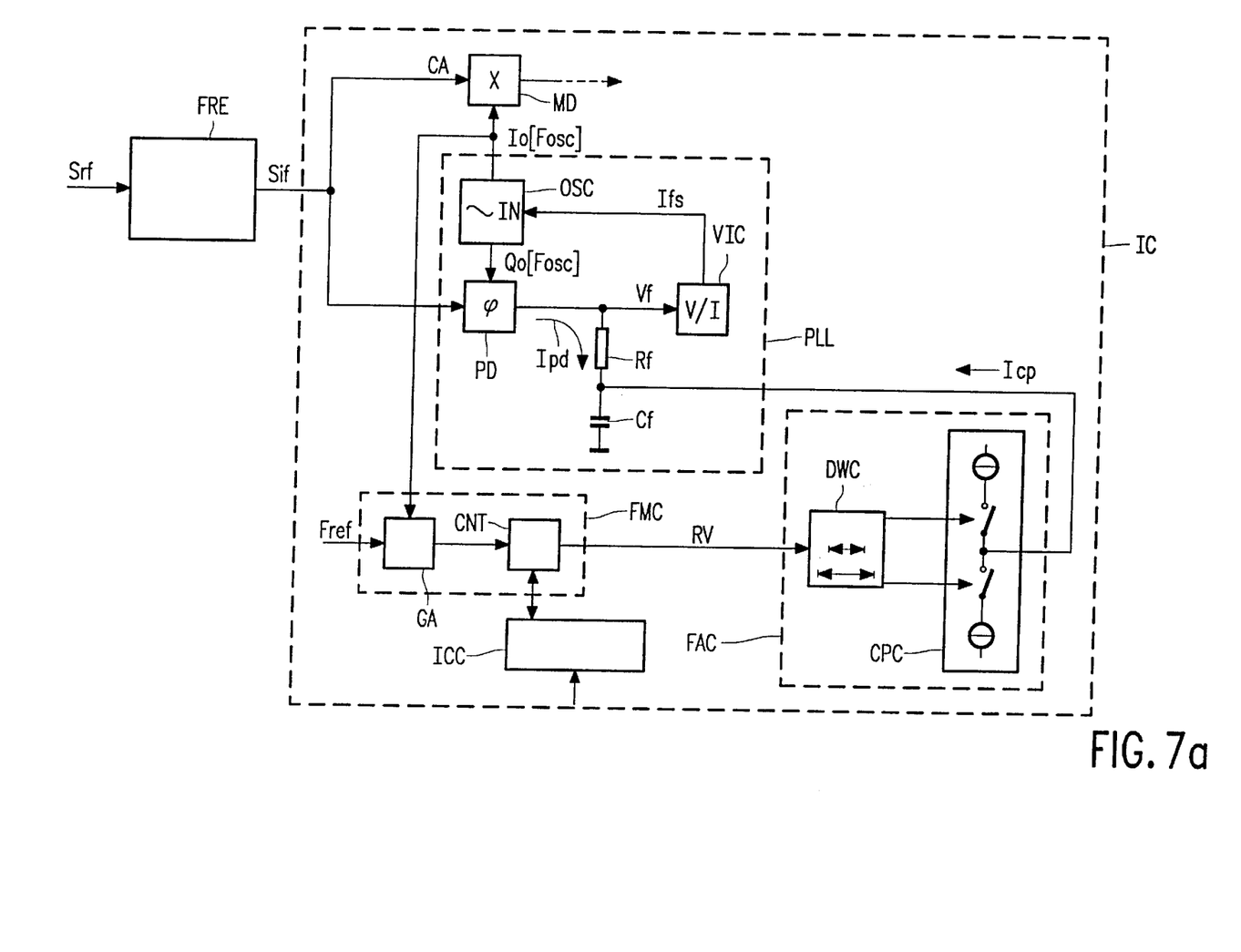
FIG. 7a is a block diagram of a further example of a receiver in accordance with the invention.

FIG. 7a illustrates a further example of a receiver in accordance with the invention. The FIG. 7a receiver incorporates the features which are illustrated in FIGS. 1, 2 and 3a and which have been discussed hereinbefore. The main constructional differences with respect to the FIG. 6 receiver are the following. In the FIG. 7a receiver, the frequency adjustment circuit FAC is formed by a double-window circuit DWC and a charge-pump circuit CPC. An output of the charge-pump circuit CPC is coupled to the loop filter LF. The phase-locked loop's oscillator OSC has a single frequency-adjustment input IN.

The FIG. 7a receiver operates as follows. The phase-locked loop's oscillator OSC is a current-controlled oscillator whose frequency is adjustable by means of a combined frequency-adjustment current Ifs applied to the single frequency-adjustment input IN. The in-phase oscillation signal Io provided by the phase-locked loop's oscillator OSC is applied, without any frequency division, to the frequency measurement circuit FMC which operates in a manner similar to that in the FIG. 6 receiver. That is, it provides the residual value RV which is a measure of the frequency difference between the frequency Fosc of the phase-locked loop's oscillator OSC and the nominal frequency of the carrier CA.

The frequency adjustment circuit FAC provides a frequency-adjustment current Icp as a function of the residual value RV. The frequency-adjustment current Icp is applied to a capacitor Cf in the loop filter LF which also receives a detection current Ipd from the phase detector PD via a resistor Rf. Accordingly, the frequency adjustment circuit FAC may change a loop-filter voltage Vf which is applied at the input of the voltage-to-current converter V/I. As a result, it may change the combined frequency-adjustment current Ifc such that the frequency Fosc of the phase-locked loop's oscillator OSC is adjusted so as to reduce the difference dF.

Figure 7B:
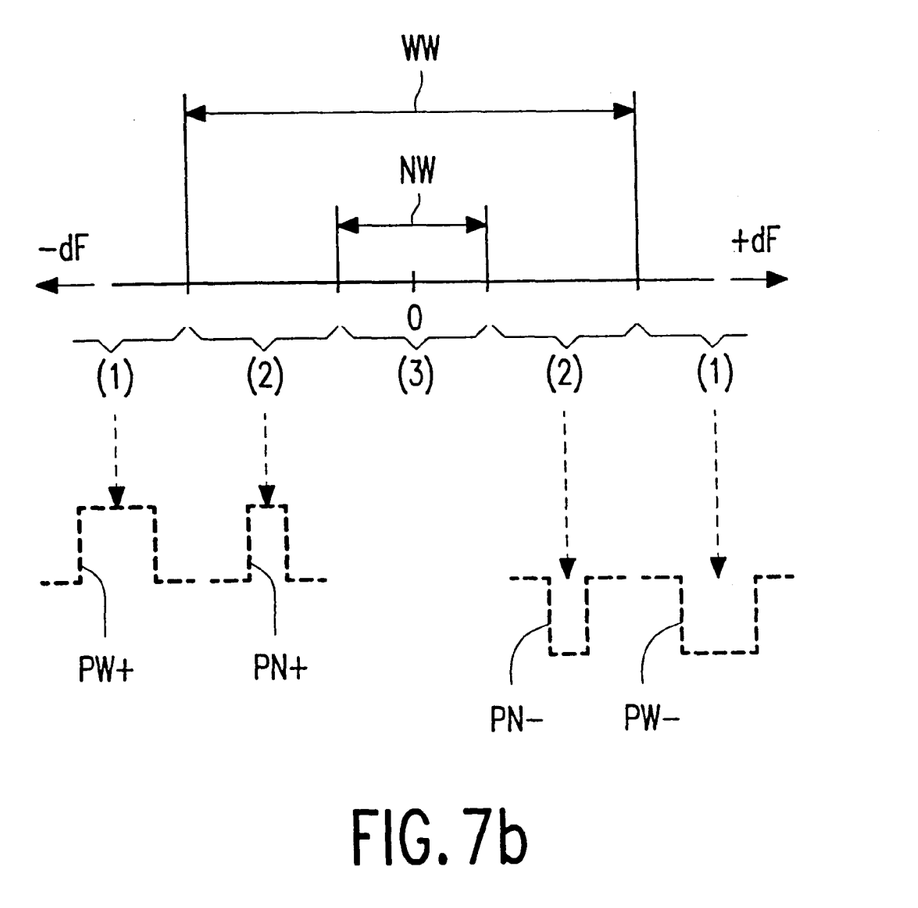
FIG. 7b is a frequency diagram for explaining the operation of the FIG. 7a receiver in greater detail.

The operation of the frequency adjustment circuit FAC will be explained in greater detail with reference to FIG. 7b. FIG. 7b is a frequency diagram in which the frequency difference dF is plotted on the horizontal axis. In FIG. 7b, a wide frequency window WW and a narrow frequency window WN is shown. The double-window circuit DWC determines, on the basis of the residual value RV, whether the frequency difference dF is within any of these two windows. There are three possible outcomes: (1) the frequency difference dF is so large that it is outside the wide frequency window WW, or (2) it is within the wide frequency window WW but outside the narrow frequency window NW, or (3) it is within the narrow frequency window NW. The consequences of these three possible outcomes will be discussed below.

First, if the frequency difference dF is so large that it is outside the wide frequency window WW, the double-window circuit DWC will force the charge-pump circuit CPC to provide a relatively wide current pulse PW+/PW−. As a result, the loop-filter voltage Vf changes to a relatively large extent and, consequently, the frequency Fosc of the phase-locked loop's oscillator OSC will be adjusted to a relatively large extent. Second, if the frequency difference dF is within the wide frequency window WW but outside the narrow window NW, the double-window circuit DWC will force the charge-pump circuit CPC to provide a relatively narrow current pulse PN+/PN−. As a result, the loop-filter voltage Vf will change to a relatively small extent and, consequently, the frequency Fosc of the phase-locked loop's oscillator OSC will be adjusted to a relatively small extent. And third, if the frequency difference dF is within the narrow frequency-window NW, the double-window circuit will force the charge-pump circuit CPC not to provide any substantial output current. As a result, the loop-filter voltage Vf will only change as a function of the detection current Ipd.

The drawings and their description given hereinbefore illustrate rather than limit the invention. It will be evident that there are numerous alternatives which fall within the scope of the appended Claims. In this respect, the following closing remarks are made.

There are numerous ways of physically spreading functions or functional elements over various units. In this respect, the drawings are very diagrammatic and represent only one possible embodiment of the invention. For example, with reference to FIG. 1, the front-end FRE may wholly or partially form a part of the integrated circuit IC. In another example, with reference to FIG. 6, the synthesizer SYN may be part of the front-end FRE. Furthermore, it should be noted that functions may be implemented by means of one or more suitably programmed computers.

Any type of signal may be supplied to the phase-locked loop PLL, as long as it comprises a component with which the phase-locked loop's oscillator OSC can be synchronised. For example, with reference to FIG. 7a, the intermediate signal Sif may be an output signal of a sound demodulator in a TV receiver which comprises a sound-system identification carrier at, for example, 55 kHz. In that case, it logically follows that the sound demodulator, which delivers the sound-system identification carrier, forms part of the front-end FRE.

Although the tuning adjustment circuit TAC in the FIG. 6 receiver is digital rather than analog, an analog type of tuning adjustment circuit is by no means excluded. For example, with reference to the FIG. 7a receiver, a second charge-pump circuit could be coupled to the double-window circuit DWC. An output of this second charge-pump circuit could be coupled, via a suitable filter, to a frequency-control input of a tuner in the front-end. Furthermore, the second charge-pump circuit could be controlled by means of an in-lock detector which indicates whether the phase-locked loop's oscillator OSC is synchronized or not. In the latter case, the second charge-pump circuit is preferably disabled.

Any reference labels in parentheses shall not be construed as limiting the claim concerned.

What is claimed is:

1. A receiver comprising:
    a front-end for processing an input signal to obtain an intermediate signal;
    a phase-locked loop for synchronizing an oscillator included in the phase-locked loop with a carrier which forms a part of the intermediate signal; and
    a calibration circuit for calibrating the phase-locked loop's oscillator;
    wherein the calibration circuit comprises:
        a frequency measurement circuit for measuring a frequency difference between a nominal frequency of the carrier and a frequency of the phase-locked loop's oscillator; and
        a frequency adjustment circuit for adjusting the frequency of the phase-locked loop's oscillator in accordance with the measured frequency difference.

2. A receiver as claimed in claim 1, wherein the frequency adjustment circuit substantially does not adjust the frequency of the phase-locked loop's oscillator throughout a range of frequency differences substantially centred around zero.

3. A receiver as claimed in claim 1, wherein the frequency adjustment circuit adjusts the frequency of the phase-locked loop's oscillator with at least two different forces for two different frequency differences, the greater of the two forces being applied for the greater of the two frequency differences.

4. A receiver as claimed in claim 1, wherein the phase-locked loop's oscillator has a coarse frequency-adjustment input and a fine frequency-adjustment input, the frequency of the phase-locked loop's oscillator being adjusted to a larger extend when a change occurs at the coarse frequency-adjustment input than if the change occurs at the fine frequency-adjustment input, the coarse frequency-adjustment input being coupled to the frequency adjustment circuit and the fine frequency-adjustment input being coupled to a phase detector included in the phase-locked loop.

5. A receiver as claimed in claim 1, wherein the front-end comprises:
    a tuner for shifting the input signal in frequency to obtain a frequency-shifted input signal; and
    a filter for extracting the intermediate signal from the frequency-shifted input signal;
    the receiver comprising:
        a tuning adjustment circuit for adjusting the frequency shift carried out by the tuner in accordance with the measured frequency difference between the nominal frequency of the carrier and the frequency of the phase-locked loop's oscillator.

6. An integrated circuit comprising:
    a phase-locked loop for synchronizing an oscillator included in the phase-locked loop with a carrier; and
    a calibration circuit for calibrating the phase-locked loop's oscillator;
    characterized in that the calibration circuit comprises:
        a frequency measurement circuit for measuring a frequency difference between a nominal frequency of the carrier and a frequency of the phase-locked loop's oscillator; and a frequency adjustment circuit for adjusting the frequency of the phase-locked loop's oscillator in accordance with the measured frequency difference.

7. A method of calibrating an oscillator of a phase-locked loop comprising:

processing an input signal to obtain an intermediate signal;

synchronizing the oscillator with a carrier which forms a part of the intermediate signal; and calibrating the oscillator by measuring a frequency difference between a nominal frequency of the carrier and a frequency of the oscillator, and adjusting the frequency of the oscillator in accordance with the measured frequency difference.

8. A method of calibrating an oscillator of a phase-locked loop comprising the acts of:

synchronizing the oscillator with a carrier; and calibrating the oscillator;

wherein the calibrating act comprises:

measuring a frequency difference between a nominal frequency of the carrier and a frequency of the phase-locked loop's oscillator; and adjusting the frequency of the phase-locked loop's oscillator in accordance with the measured frequency difference.

* * * * *

UNITED STATES PATENT AND TRADEMARK OFFICE
CERTIFICATE OF CORRECTION

PATENT NO.   : 6,795,695 B1
DATED        : September 21, 2004
INVENTOR(S)  : Johannes H.A. Brekelmans, Hans J. Kunz and Johannes S. Vromans It is certified that error appears in the above-identified patent and that said Letters Patent is hereby corrected as shown below:

<u>Title page,</u>
Item [75], Inventors, should read -- Johannes H.A. Brekelmans, Hans J. Kühn, Johannes S. Vromans --

Signed and Sealed this

Twenty-first Day of June, 2005

JON W. DUDAS
*Director of the United States Patent and Trademark Office*